(12) United States Patent
Nishiwaki et al.

(10) Patent No.: US 8,072,243 B2
(45) Date of Patent: Dec. 6, 2011

(54) SEMICONDUCTOR DEVICE WITH TRANSISTORS HAVING SUBSTANTIAL THE SAME CHARACTERISTIC VARIATIONS

(75) Inventors: Akifumi Nishiwaki, Kasugai (JP); Masaki Komaki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/684,654

(22) Filed: Jan. 8, 2010

(65) Prior Publication Data

US 2010/0213979 A1    Aug. 26, 2010

(30) Foreign Application Priority Data

Feb. 26, 2009    (JP) ................................ 2009-044542

(51) Int. Cl.
*H03K 19/00*    (2006.01)
(52) U.S. Cl. ........................... 326/101; 326/29; 326/112
(58) Field of Classification Search .......... 326/101–103, 326/112, 114, 119–122, 29
See application file for complete search history.

(56) References Cited

U.S. PATENT DOCUMENTS

| 5,077,495 A | 12/1991 | Torimaru et al. |
| 5,701,094 A * | 12/1997 | Sridhar et al. ................. 326/113 |
| 7,256,622 B2 * | 8/2007 | Dronavalli ..................... 326/121 |
| 7,791,373 B2 * | 9/2010 | Kurokawa ....................... 326/81 |

FOREIGN PATENT DOCUMENTS

| JP | 02-089365 A | 3/1990 |
| JP | 02-218096 A | 8/1990 |

* cited by examiner

*Primary Examiner* — James H Cho
(74) *Attorney, Agent, or Firm* — Arent Fox LLP

(57) ABSTRACT

A semiconductor device is provided. The semiconductor device includes a first circuit provided between a power source voltage line and a ground line, including at least two first MOS transistors coupled in parallel and a second circuit, which is provided between the power source voltage line and the ground line, including at least two second MOS transistors coupled in series. The gate length and the gate width of the first MOS transistor are adjusted so that the first MOS transistor has a gate area allowing a first characteristic variation of the first MOS transistor to be substantially equal to a second characteristic variation of the second MOS transistor.

12 Claims, 6 Drawing Sheets

SEMICONDUCTOR DEVICE WITH TRANSISTORS HAVING SUBSTANTIAL THE SAME CHARACTERISTIC VARIATIONS

CROSS-REFERENCE TO RELATED APPLICATIONS

This application claims the benefit of priority from Japanese Patent Application No. 2009-44542 filed on Feb. 26, 2009, the entire contents of which are incorporated herein by reference.

BACKGROUND

1. Field

Embodiments discussed herein relate to a semiconductor device and a method for layouting the semiconductor device.

2. Description of Related Art

A semiconductor device includes a logic circuit (random logic) having a specific processing function. The logic circuit includes a cell, and the cell includes an inverter circuit, NAND circuit or NOR circuit which is constituted of a single or a plurality of MOS transistors.

Subsequent to verification of the logic design, the logic circuit is laid out. Based on the laid-out logic circuit, a delay time is calculated, and based on the delay time, the timing is verified. When there is a problem with the timing, a gate size of the MOS transistor, such as a gate length or a gate width of the MOS transistor, is modified or a buffer or the like is inserted to solve the timing problem.

As the gate length of the MOS transistor is increased, the off-leak current decreases. On the contrary, as the gate length of the MOS transistor is shortened, the off-leak current thereof increases. In the logic circuit, the gate length of the MOS transistor included in the cell is increased to reduce the off-leak current, thereby lowering power consumption.

Related art is disclosed in Japanese Laid-open Patent Publication No. H02-218096, Japanese Laid-open Patent Publication No. H02-089365 or the like.

SUMMARY

According to one aspect of the embodiments, a semiconductor device is provided. The semiconductor device includes: a first circuit provided between a power source voltage line and a ground line, the first circuit including at least two first MOS transistors coupled in parallel, and a second circuit provided between the power source voltage line and the ground line, the second circuit including at least two second MOS transistors coupled in series. The gate length and the gate width of the first MOS transistor are adjusted so that the first MOS transistor has a gate area allowing a first characteristic variation of the first MOS transistor to be substantially equal to a second characteristic variation of the second MOS transistor.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1:
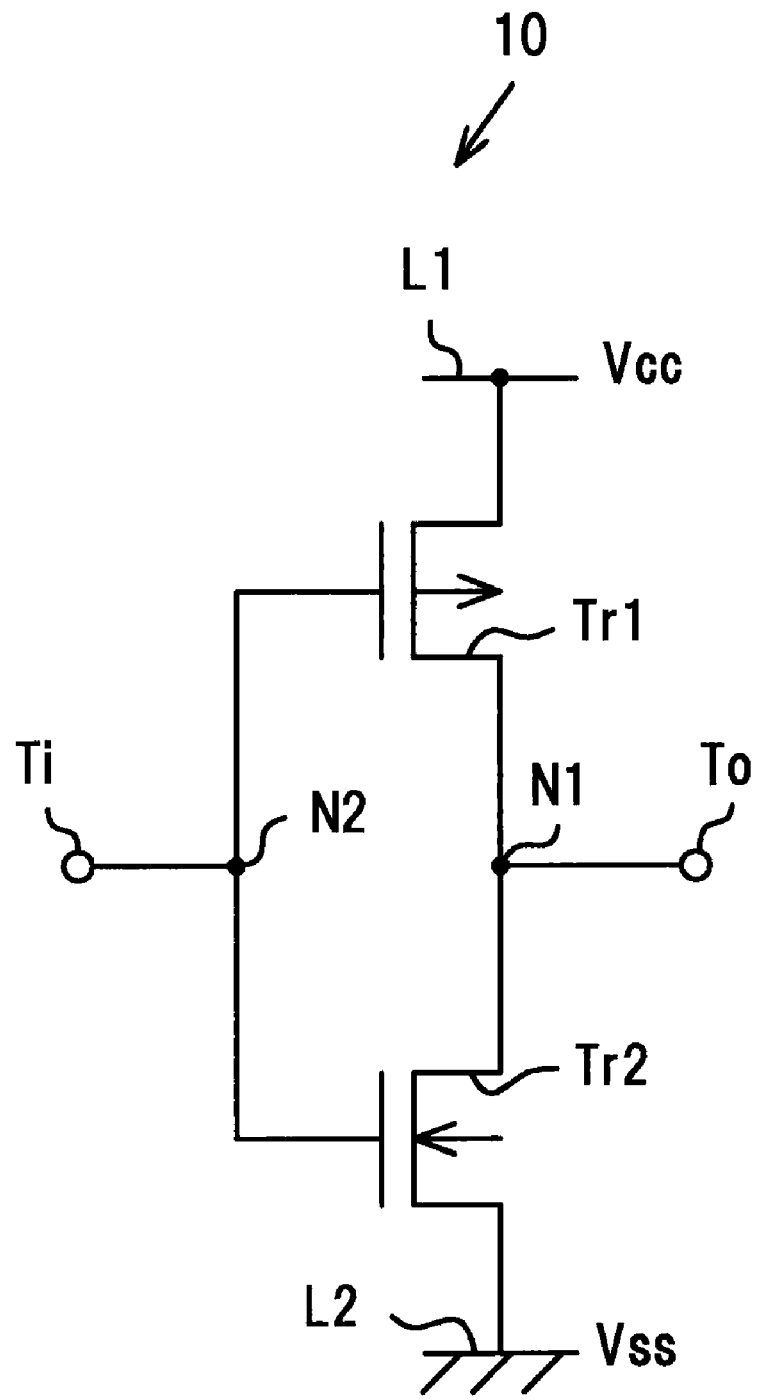
FIG. 1 illustrates an exemplary inverter circuit.

An inverter circuit includes an N-channel MOS transistor and a P-channel MOS transistor arranged between a power source voltage line and a ground line. The off-leak current of the N-channel MOS transistor is greater than that of the P-channel MOS transistor due to carrier difference. Accordingly, in the inverter circuit, the gate length of the N-channel MOS transistor is set greater than that of P-channel MOS transistor, so that the off-leak current of the N-channel MOS transistor is reduced to be substantially equal to that of the P-channel MOS transistor.

A NAND circuit includes a plurality of N-channel MOS transistors coupled in series to the ground potential side and a plurality of P-channel MOS transistors coupled in parallel to the power source voltage side. In the NAND circuit, since a signal having a low level is output via the plurality of N-channel MOS transistors coupled in series, an inversion time for inverting (leveling down) from a high level to a low level is long. On the contrary, since a signal having a high level is output via the plurality of P-channel MOS transistors coupled in parallel, an inversion time for inverting (leveling up) from a low level to a high level is short.

Since the level-up inversion time becomes substantially equal to the level-down inversion time in the NAND circuit, the gate width of the P-channel MOS transistor is short. The gate length of the N-channel MOS transistor may be set short to shorten the inversion time. However, when the gate length of N-channel MOS transistor is set short, the off-leak current may increase.

A NOR circuit includes a plurality of N-channel MOS transistors coupled in parallel to the ground potential side and a plurality P-channel MOS transistors coupled in series to the power source voltage side. In the NOR circuit, since a signal having a low level is output via the plurality of N-channel MOS transistors coupled in parallel, an inversion time for inverting (leveling down) from a high level to a low level is short. On the contrary, since a signal having a high level is output via the plurality of P-channel MOS transistors coupled in series from the power source voltage, an inversion time for inverting (leveling up) from a low level to a high level is long.

Since the level-up inversion time becomes substantially equal to the level-down inversion time in the NOR circuit, the gate width of the N-channel MOS transistor is set short.

Characteristic variations of the MOS transistor occurring during a fabrication process of a semiconductor device include a variation in inversion time or off-leak current.

Characteristic variation σn of the MOS transistor is described as the following formula (1).

$$\sigma n = A/(n)^{1/2}$$

$$A = K/(L \times W)^{1/2} \qquad (1)$$

"σn" denotes a characteristic variation, and "A" denotes a characteristic variation when a single MOS transistor is arranged between a power source voltage line and an output terminal or between a ground line and the output terminal. "n" denotes the number of MOS transistors coupled in series between the power source voltage line and the output terminal or between the ground line and the output terminal. "K" denotes variation coefficient K. The variation coefficient K may vary depending on the P-channel MOS transistor and N-channel MOS transistor. "L" denotes a gate length. "W" denotes a gate width.

As the number n of MOS transistors coupled in series between the power source voltage line and the output terminal or between the ground line and the output terminal is increased, the characteristic variation σn of the MOS transistor becomes smaller. The number n of MOS transistors coupled in series between the power source voltage line and the output terminal or between the ground line and the output terminal is reduced, the characteristic variation σn of the MOS transistor coupled in series becomes greater.

Characteristic variation σn of the MOS transistor is calculated based on a gate area obtained by multiplying the gate length L by the gate width W. As the gate area is increased, the characteristic variation σn of the MOS transistor becomes small. As the gate area is reduced, characteristic variation σn of the MOS transistor becomes great.

When the gate length L and gate width W of the plurality of MOS transistors included in the cell are adjusted, the gate areas of the MOS transistors are different from each other. For example, the number of MOS transistors arranged between the power source voltage line and the output terminal is substantially equal to the number of MOS transistors arranged between the ground line and the output terminal, the gate area of the MOS transistors arranged between the power source voltage line and the output terminal may be different from the gate area of the MOS transistors arranged between the ground line and the output terminal. As a result, the characteristic variation σn of the MOS transistors may be different.

In a static timing analysis (STA), the greater characteristic variation σn is used so a MOS transistor having smaller characteristic variation σn may have an increased margin.

FIG. 1 illustrates an exemplary inverter circuit. An inverter circuit 10 includes a first transistor Tr1, which may be a P-channel MOS transistor, and a second transistor Tr2, which may be an N-channel MOS transistor.

A drain of the first transistor Tr1 is coupled to a drain of the second transistor Tr2. A node N1 of a connection point between the first transistor Tr1 and the second transistor Tr2 outputs an output signal via an output terminal To. A source of the first transistor Tr1 is coupled to a power source voltage line L1 and a gate of the first transistor Tr1 is coupled to a gate of the second transistor Tr2. A node N2 of a connection point between the first transistor Tr1 and the second transistor Tr2 receives an input signal via an input terminal Ti.

Figure 2:
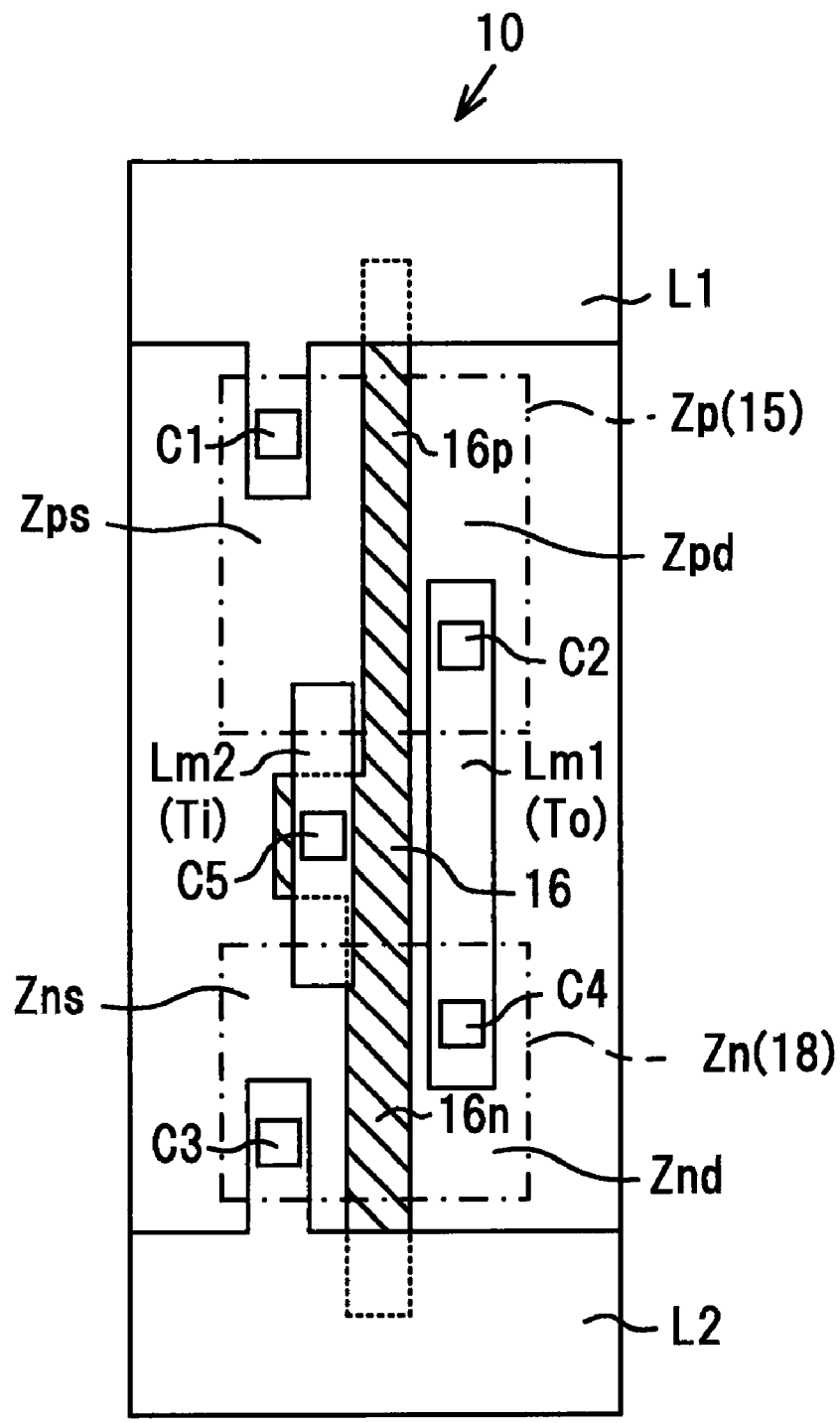
FIG. 2 illustrates an exemplary layout of an inverter circuit.

A source of the second transistor Tr2 is coupled to a ground line L2. FIG. 2 illustrates an exemplary layout of an inverter circuit. The inverter circuit illustrated in FIG. 2 may be substantially the same as or similar to the inverter circuit 10 illustrated in FIG. 1. The inverter circuit 10 includes a P region Zp corresponding to the first transistor Tr1 and an N region Zn corresponding to the second transistor Tr2.

The P region Zp includes a rectangular p-type diffusion region pattern 15. The N region Zn includes a rectangular n-type diffusion region pattern 18. In the p-type diffusion region pattern 15 and the n-type diffusion region pattern 18, a gate wire pattern 16 is formed to extend across the two patterns 15 and 18. The gate wire pattern 16 extends to the centers of the power source voltage line pattern L1 and the ground line pattern L2 which are arranged in the upper layer.

In both sides of the p-type diffusion region pattern 15, a p-type source region Zps and a p-type drain region Zpd are arranged so that the gate wire pattern 16 lies between the two regions. The gate length L of a gate wire pattern 16p included in the gate wire pattern 16 on the p-type diffusion region pattern 15 may be 60 nm, and the gate width W thereof may be 350 nm. Thus the gate area (=L×W) of the gate wire pattern 16p may be 21000 nm².

The p-type source region Zps is coupled via a first contact C1 to the power source voltage line pattern L1. The p-type drain region Zpd is coupled via a second contact C2 to a first metal wire pattern Lm1 corresponding to an output terminal To.

In both sides of the n-type diffusion region pattern 18, an n-type source region Zns and an n-type drain region Znd are arranged so that the gate wire pattern 16 lies between the two regions. The gate length L of a gate wire pattern 16n included in the gate wire pattern 16 on the n-type diffusion region pattern 18 may be 70 nm, and the gate width W thereof may be 300 nm. The n-type source region Zns is coupled via a third contact C3 to the ground line pattern L2. The n-type drain region Znd is coupled via a fourth contact C4 to the first metal wire pattern Lm1. The gate area (=L×W) of the gate wire pattern 16n may be 21000 nm² and may be substantially equal to that of the gate wire pattern 16p.

The gate wire pattern 16 is coupled to a second metal wire pattern Lm2 corresponding to an input terminal Ti at an intermediate position between the P region Zp and the N region Zn via a fifth contact C5. In the inverter circuit 10, the gate length L (=70 nm) of the second transistor Tr2 may be longer than the gate length L (=60 nm) of the first transistor Tr1 by 10 nm. Thus, when the gate areas of an N-channel MOS transistor and P-channel MOS transistor are substantially equal to each other, the off-leak current of the N-channel MOS transistor may be greater than that of the P-channel MOS transistor. However, the off-leak current of the second transistor Tr2, which is an N-channel MOS transistor, having a gate length L (=60 nm), which is longer by 10 nm, is reduced to that of the first transistor Tr1, which is a P-channel MOS transistor.

In the inverter circuit 10, the gate width W of the first transistor Tr1, for example, 350 nm may be 50 nm greater than that of the second transistor Tr2, for example, 300 nm. Thus the gate areas of the gate wire patterns 16p and 16n of the first and second transistors Tr1 and Tr2 are each 21000 nm². In the inverter circuit 10, the number of MOS transistors arranged between the power source voltage line L1 and the output terminal To is substantially equal to the number of MOS transistors arranged between the ground line L2 and the output terminal To, for example, the number is one. Thus, the first and second transistors Tr1 and Tr2 may become substantially equal in characteristic variation σn.

Since the first and second transistors Tr1 and Tr2 of the inverter circuit 10 are substantially equal in characteristic variation σn, the characteristic variation σn of the inverter circuit 10 in the static timing analysis is set to the characteristic variation σn of the first and second transistors Tr1 and Tr2. As a result, the driving capacity of the first and second transistors Tr1 and Tr2 is optimally adjusted.

Figure 3:
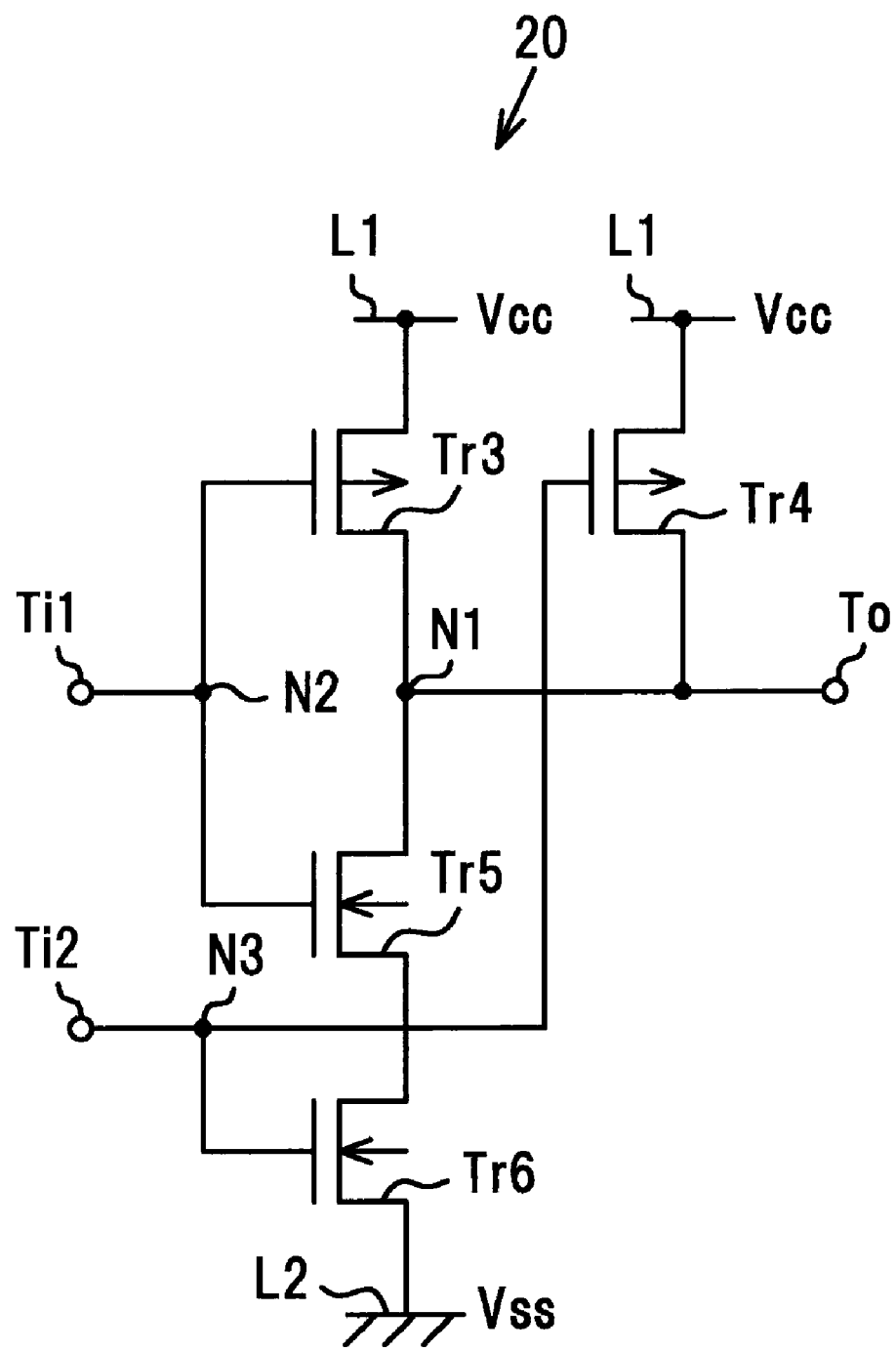
FIG. 3 illustrates an exemplary NAND circuit.

FIG. 3 illustrates an exemplary NAND circuit. A NAND circuit 20 includes third and fourth transistors Tr3 and Tr4, which are P-channel MOS transistors, and fifth and sixth transistors Tr5 and Tr6 which are N-channel MOS transistors.

Drains of the third transistor Tr3 and fourth transistor Tr4 are each coupled to a drain of the fifth transistor Tr5. A node N1 corresponding to a connection point between the third transistor Tr3 and the fourth transistor Tr4 outputs an output signal via an output terminal To. A source of the third transistor Tr3 is coupled to a power source voltage line L1. A gate of the third transistor Tr3 is coupled to a gate of the fifth transistor Tr5. A node N2 corresponding to a connection, point between the third transistor Tr3 and the fifth transistor Tr5 receives an input signal via a first input terminal Ti1. A source of the fourth transistor Tr4 is coupled to the power source voltage line L1. A gate of the fourth transistor Tr4 is coupled to a gate of the sixth transistor Tr6. A node N3 corresponding to a connection point between the fourth transistor Tr4 and sixth transistor Tr6 receives an input signal via a second input terminal Ti2.

A source of the fifth transistor Tr5 is coupled to a drain of the sixth transistor Tr6. A source of the sixth transistor Tr6 is coupled to the ground line L2.

In the NAND circuit 20, the third and fourth transistors Tr3 and Tr4, which are P-channel MOS transistors, are coupled in parallel between the power source voltage line L1 and the output terminal To. In the NAND circuit 20, the fifth and sixth transistors Tr5 and Tr6, which are N-channel MOS transistors, are coupled in series between the ground line L2 and the output terminal To.

Thus, an inversion time for inverting (leveling up) from a low level to a high level is shorter than an inversion time for inverting (leveling down) from a high level to a low level. The off-leak current of the third and fourth transistors Tr3 and Tr4 is greater than that of the fifth and sixth transistors Tr5 and Tr6.

When a plurality of MOS transistors are coupled in series, characteristic variation σn of the MOS transistors is, for example as indicated by formula (1), small in compared with when a single MOS transistor having the same gate area is used.

In the NAND circuit 20, since the fifth and sixth transistors Tr5 and Tr6 are coupled in series, the characteristic variation σn of the fifth and sixth transistors Tr5 and Tr6 is $A/(2)^{1/2}$. Since the third and fourth transistors Tr3 and Tr4 are not coupled in series, the characteristic variation σn of the third and fourth transistors Tr3 and Tr4 is $A/(1)^{1/2}=A$. Thus, if the transistors have the same gate area, the characteristic variation σn of the fifth and sixth transistors Tr5 and Tr6 is smaller than that of the third and fourth transistors Tr3 and Tr4.

In order to substantially equalize the characteristic variations σn of the third to sixth transistors Tr3 to Tr6, the gate area of the fifth and sixth transistors Tr5 and Tr6 is adjusted to be substantially equal to $1/(2)^{1/2}$ of the gate area of the third and fourth transistors Tr3 and Tr4.

When the gate area of the fifth and sixth transistors Tr5 and Tr6 is adjusted to be substantially equal to $1/(2)^{1/2}$ of the gate area of the third and fourth transistors Tr3 and Tr4, the off-leak current of the fifth and sixth transistors Tr5 and Tr6 becomes greater. Therefore, the gate area of the third and fourth transistors Tr3 and Tr4 is set to $(2)^{1/2}$ times as great as that of the fifth and sixth transistors Tr5 and Tr6.

Figure 4:
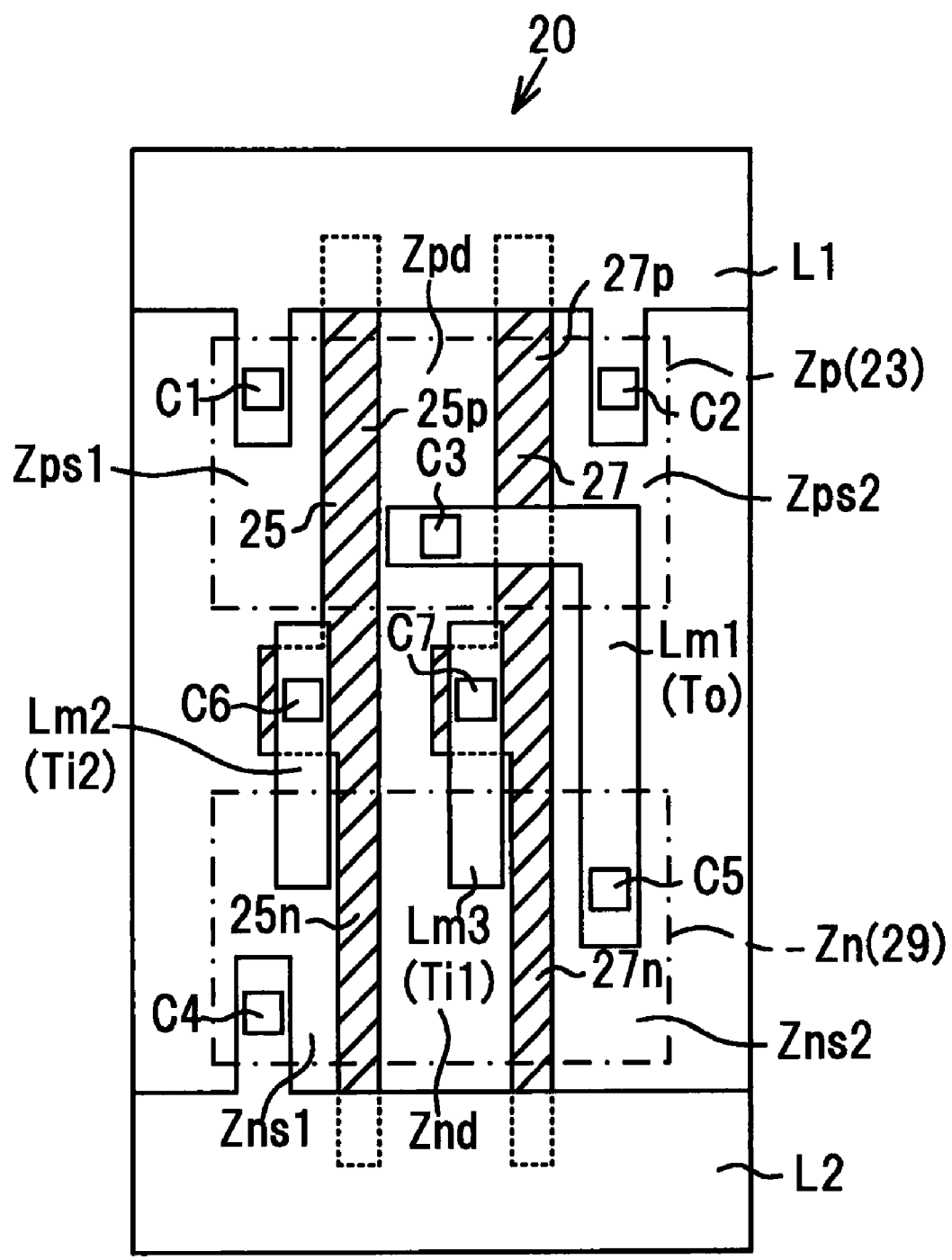
FIG. 4 illustrates an exemplary layout of a NAND circuit.

FIG. 4 illustrates an exemplary layout of a NAND circuit. The NAND circuit illustrated in FIG. 4 may be the NAND circuit 20 illustrated in FIG. 3. The NAND circuit 20 includes a P region Zp including third and fourth transistors Tr3 and Tr4, which are P-channel MOS transistors, and an N region Zn including fifth and sixth transistors Tr5 and Tr6, which are N-channel MOS transistors.

In the P region Zp, a rectangular p-type diffusion region pattern 23 is formed. In the N region Zn, a rectangular n-type diffusion region pattern 29 is formed. In the p-type diffusion region pattern 23 and the n-type diffusion region pattern 29, first and second gate wire patterns 25 and 27 are formed in parallel to extend across the patterns 23 and 29. The first and second gate wire patterns 25 and 27 extend to the centers of the power source voltage line pattern L1 and ground line pattern L2 which are arranged in the upper layer.

A first gate wire pattern 25p included in the first gate wire pattern 25 on the p-type diffusion region pattern 23 corresponds to a gate of the fourth transistor Tr4. A first gate wire pattern 25n included in the first gate wire pattern 25 on the n-type diffusion region pattern 29 corresponds to a gate of the sixth transistor Tr6. A second gate wire pattern 27p included in the second gate wire pattern 27 on the p-type diffusion region pattern 23 corresponds to a gate of the third transistor Tr3. A second gate wire pattern 27n included in the second gate wire pattern 27 on the n-type diffusion region pattern 29 corresponds to a gate of the fifth transistor Tr5.

In the p-type diffusion region pattern 23, a first p-type source region Zps1 of the fourth transistor Tr4 is to the left of the first gate wire pattern 25p. In the p-type diffusion region pattern 23, a p-type drain region Zpd of drains of the third and fourth transistors Tr3 and Tr4 is arranged between the first gate wire pattern 25p and the second gate wire pattern 27p. In the p-type diffusion region pattern 23, a second p-type source region Zps2 of a source of the third transistor Tr3 is to the right of the second gate wire pattern 27p.

A source of the fourth transistor Tr4 corresponds to the first p-type source region Zps1. A drain of the fourth transistor Tr4 corresponds to the p-type drain region Zpd. A gate of the fourth transistor Tr4 corresponds to the first gate wire pattern 25p. A source of the third transistor Tr3 corresponds to the second p-type source region Zps2. A drain of the third transistor Tr3 corresponds to the p-type drain region Zpd. A gate of the third transistor Tr3 corresponds to the second gate wire pattern 27p.

The gate length L of the first and second gate wire patterns 25p and 27p may be 85 nm, and the gate width W thereof may be 300 nm. The gate areas (=L×W) of the first and second gate wire patterns 25p and 27p may be each 25500 nm².

The first and second p-type source region Zps1 and Zps2 are coupled via first and second contacts C1 and C2 to the power source voltage line pattern L1. The p-type drain region Zpd is coupled via a third contact C3 to a first metal wire pattern Lm1 as an output terminal To.

In the n-type diffusion region pattern 29, a first n-type source region Zns1 corresponding to a source of the sixth transistor Tr6 is to the left of the first gate wire pattern 25n. In the n-type diffusion region pattern 29, an n-type drain region Znd corresponding to drains of the fifth and sixth transistors Tr5 and Tr6 is arranged between the first gate wire pattern 25n and the second gate wire pattern 27n. In the n-type diffusion region pattern 29, a second n-type source region Zns2 corresponding to a source of the fifth transistor Tr5 is to the right of the second gate wire pattern 27n.

The source of the sixth transistor Tr6 corresponds to the first n-type source region Zns1. The drain of the sixth transistor Tr6 corresponds to the n-type drain region Znd. The gate of the sixth transistor Tr6 corresponds to the first gate wire pattern 25n. The source of the fifth transistor Tr5 corresponds to the second n-type source region Zns2. The drain of the fifth transistor Tr5 corresponds to the n-type drain region Znd. The gate of the fifth transistor Tr5 corresponds to the second gate wire pattern 27n.

The gate length L of the first and second gate wire patterns 25n and 27n may be 60 nm, and the gate width W thereof may be 300 nm. Therefore the gate area (=L×W) of the first and second gate wire patterns 25n and 27n may be each 18000 nm².

The first n-type source region Zns1 is coupled via a fourth contact C4 to the ground line pattern L2. The second n-type source region Zns2 is coupled via a fifth contact C5 to the first metal wire pattern Lm1.

The first gate wire pattern 25 is coupled via a sixth contact C6 to a second metal wire pattern Lm2 corresponding to a second input terminal Ti2. The second gate wire pattern 27 is coupled via a seventh contact C7 to a third metal wire pattern Lm3 corresponding to a first input terminal Ti1.

In the NAND circuit 20, the gate length L, for example, 85 nm of the third and fourth transistors Tr3 and Tr4 may be 25 nm longer than the gate length L for example, 60 nm of the fifth and sixth transistors Tr5 and Tr6. As a result, the level-up inversion time of the third and fourth transistors Tr3 and Tr4 may be substantially equal to the level-down inversion time of the fifth and sixth transistors Tr5 and Tr6. Since third and fourth transistors Tr3 and Tr4 have a long gate length, the off-leak current may be small.

The gate area of the third and fourth transistors Tr3 and Tr4 may be 25500 nm$^2$. The gate area of the fifth and sixth transistors Tr5 and Tr6 may be 18000 nm$^2$. The gate area of the fifth and sixth transistors Tr5 and Tr6 is $1/(2)^{1/2}$ of the gate area of the third and fourth transistors Tr3 and Tr4. The NAND circuit 20 includes the third transistor Tr3 and the fourth transistor Tr4 coupled between the power source voltage line L1 and the output terminal To, and the fifth and sixth transistors Tr5 and Tr6 coupled in series between the ground line L2 and the output terminal To. Thus the third to sixth transistors Tr3 to Tr6 may be substantially equal in characteristic variation σn.

Since the third to sixth transistors Tr3 to Tr6 of the NAND circuit 20 are substantially equal in characteristic variation σn, the characteristic variation σn of the NAND circuit 20 in the static timing analysis is set to the characteristic variation σn of the third to sixth transistors Tr3 to Tr6. As a result, the driving capacity of the third to sixth transistors Tr3 to Tr6 is optimally adjusted in the static timing analysis.

Figure 5:
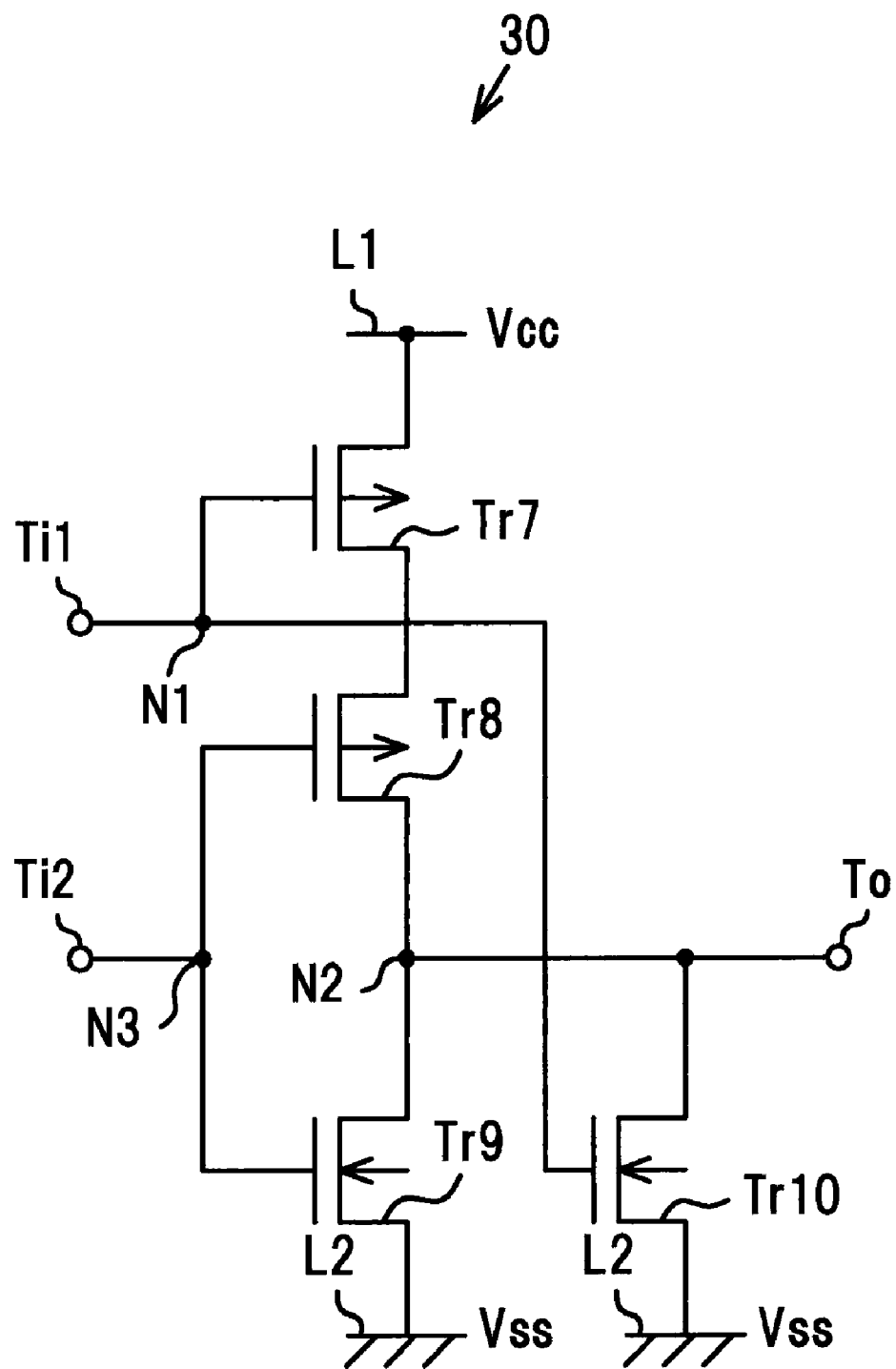
FIG. 5 illustrates an exemplary NOR circuit.

FIG. 5 illustrates an exemplary NOR circuit. A NOR circuit 30 includes seventh and eighth transistors Tr7 and Tr8 which are P-channel MOS transistors, and ninth and tenth transistors Tr9 and Tr10, which are N-channel MOS transistors.

A drain of the seventh transistor Tr7 is coupled to a source of the eighth transistor Tr8, and a source of the seventh transistor Tr7 is coupled to a power source voltage line L1. A gate of the seventh transistor Tr7 is coupled to a gate of the tenth transistor Tr10. A node N1 corresponding to a connection point between the seventh transistor Tr7 and the tenth transistor Tr10 receives an input signal via a first input terminal Ti1.

A drain of the eighth transistor Tr8 is coupled to drains of the ninth and tenth transistors Tr9 and Tr10. A node N2 corresponding to a connection point therebetween outputs an output signal via an output terminal To. A gate of the eighth transistor Tr8 is coupled to a gate of the ninth transistor Tr9. A node N3 corresponding to a connection point therebetween receives an input signal via a second input terminal Ti2.

Sources of the ninth and tenth transistors Tr9 and Tr10 are coupled to a ground line L2. The NOR circuit 30 includes the seventh and eighth transistors Tr7 and Tr8 coupled in series between the power source voltage line L1 and the output terminal To. The NOR circuit 30 includes the ninth and tenth transistors Tr9 and Tr10 coupled in parallel between the ground line L2 and the output terminal To.

Thus, an inversion time for inverting (leveling down) from a high level to a low level may be shorter than an inversion time for inverting (leveling up) from a low level to a high level. The off-leak current of the ninth and tenth transistors Tr9 and Tr10 may be greater than the off-leak current of the seventh and eighth transistors Tr7 and Tr8.

Since, in the NOR circuit 30, the seventh and eighth transistors Tr7 and Tr8 are coupled in series, the characteristic variation σn of the seventh and eighth transistors Tr7 and Tr8 may be $1/(2)^{1/2}$ of the characteristic variation σn of the ninth and tenth transistors Tr9 and Tr10 according to the above described formula (1) if the transistors have substantially the same gate area.

In order to substantially equalize the characteristic variations σn of the seventh to tenth transistors Tr7 to Tr10, the gate area of the seventh to tenth transistors Tr7 to Tr10 is adjusted. The gate area of the seventh and eighth transistors Tr7 and Tr8 may be $1/(2)^{1/2}$ of the gate area of the ninth and tenth transistors Tr9 and Tr10.

When the gate area of the seventh and eighth transistors Tr7 and Tr8 is $1/(2)^{1/2}$ of the gate area of the ninth and tenth transistors Tr9 and Tr10, the off-leak current of the seventh and eighth transistors Tr7 and Tr8 may become greater. Thus the gate area of the ninth and tenth transistors Tr9 and Tr10 may be $(2)^{1/2}$ times as great as the gate area of the seventh and eighth transistors Tr7 and Tr8.

Figure 6:
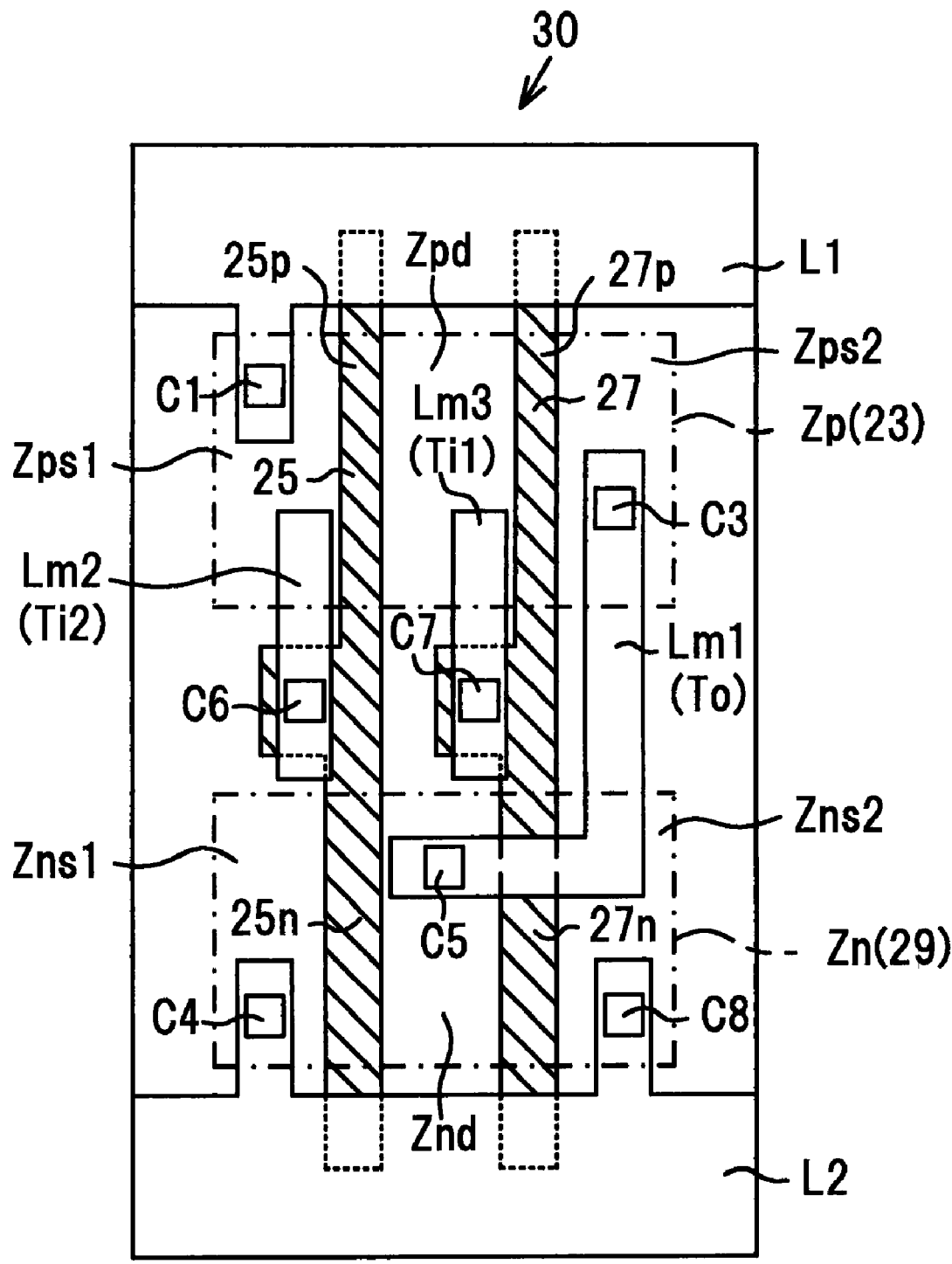
FIG. 6 illustrates an exemplary layout of a NOR circuit.

FIG. 6 illustrates an exemplary layout of a NOR circuit. A NOR circuit illustrated in FIG. 6 may be the NOR circuit 30 illustrated in FIG. 5. The NOR circuit 30 and the NAND circuit 20 are different in the connection between the first metal wire pattern Lm1 and the power source voltage line pattern L1, the connection between the first metal wire pattern Lm1 and the ground line pattern L2 and the gate length L and gate width W of the first and second gate wire patterns 25 and 27. In other aspects, the layout of the NOR circuit 30 is substantially the same or similar to that of the NAND circuit 20, and, for this reason, the same reference characters are applied to parts corresponding to those Of the NAND circuit 20, and an explanation thereof is omitted or reduced.

The gate length L of first and second gate wire patterns 25p and 27p on a p-type diffusion region pattern 23 may be 60 nm, and the gate width W thereof may be 300 nm. The gate length L of first and second gate wire patterns 25n and 27n on an n-type diffusion region pattern 29 may be 85 nm, and the gate width W thereof may be 300 nm.

A ground line pattern L2 is coupled via an eighth contact C8 to a second n-type source region Zns2 of an N region Zn. The first metal wire pattern Lm1 is coupled via a third contact C3 to a second p-type source region Zps2 of a P region Zp, and also coupled via a fifth contact C5 to an n-type drain region Znd of the N region Zn.

In the NOR circuit 30, the gate length L, for example, 85 nm of the ninth and tenth transistors Tr9 and Tr10 may be longer than the gate length L, for example, 60 nm of the seventh and eighth transistors Tr7 and Tr8 by 25 nm. As a result, the level-down inversion time of the ninth and tenth transistors Tr9 and Tr10 may be substantially equal to the level-up inversion time of the seventh and eighth transistors Tr7 and Tr8. Since the ninth and tenth transistors Tr9 and Tr10 have a longer gate length, the off-leak current may be smaller.

The gate area of the seventh and eighth transistors Tr7 and Tr8 may be 18000 nm$^2$. The gate area of the ninth and tenth transistors Tr9 and Tr10 may be 25500 nm$^2$. The gate area of the seventh and eighth transistors Tr7 and Tr8 coupled in series is $1/(2)^{1/2}$ of the gate area of the ninth and tenth transistors Tr9 and Tr10. The NOR circuit 30 includes the seventh and eighth transistors Tr7 and Tr8 coupled in series between the power source voltage line L1 and the output terminal To, and the ninth and tenth transistors Tr9 and Tr10 coupled in parallel between the ground line L2 and the output terminal To. Therefore, the seventh to tenth transistors Tr7 to Tr10 may be substantially equal in characteristic variation σn.

Since the seventh to tenth transistors Tr7 to Tr10 in the NOR circuit 30 are substantially equal in characteristic variation σn, the characteristic variation σn of the NOR circuit 30 in a static timing analysis is set to the characteristic variation σn of the seventh to tenth transistors Tr7 to Tr10. As a result, the driving capacity of the seventh to tenth transistors Tr7 to Tr10 is optimized.

In the inverter circuit 10, when the off-leak current and the inversion time are adjusted, the gate length L or the gate width W of the MOS transistors included in the cell is adjusted so that the MOS transistors included in the cell are substantially equal in gate area.

Therefore, the MOS transistors included in the cell may be substantially equal in characteristic variation σn. In the static timing analysis, characteristic variation σn corresponding to all the MOS transistors is set, so the driving capacity thereof is optimally adjusted.

The NAND circuit 20 includes the third and fourth transistors Tr3 and Tr4 coupled in parallel between the power source voltage line L1 and the output terminal To, and the fifth and sixth transistors Tr5 and Tr6 coupled in series between the ground line L2 and the output terminal To. So that the characteristic variation σn of the third and fourth transistors Tr3 and Tr4 coupled in parallel becomes substantially equal to that of the fifth and sixth transistors Tr5 and Tr6 coupled in series according to the above described formula (I), the gate area of the third and fourth transistors Tr3 and Tr4 may be greater than the gate area of the fifth and sixth transistors Tr5 and Tr6.

In the third and fourth transistors Tr3 and Tr4 coupled in parallel, which have a greater off-leak current than the fifth and sixth transistors Tr5 and Tr6 coupled in series, the gate area may increase if the gate length L is increased. Therefore the off-leak current of the third and fourth transistors Tr3 and Tr4 may decrease and the current consumption of the NAND circuit 20 may be reduced.

The NOR circuit 30 includes the seventh and eighth transistors Tr7 and Tr8 coupled in series between the power source voltage line L1 and the output terminal To, and the ninth and tenth transistors Tr9 and Tr10 coupled in parallel between the ground line L2 and the output terminal To. So that the characteristic variation σn of the ninth and tenth transistors Tr9 and Tr10 coupled in parallel becomes substantially equal to that of the seventh and eighth transistors Tr7 and Tr8 coupled in series, the gate area of the ninth and tenth transistors Tr9 and Tr10 coupled in parallel is greater than the gate area of the seventh and eighth transistors Tr7 and Tr8 coupled in series.

In the ninth and tenth transistors Tr9 and Tr10 coupled in parallel, which have a greater off-leak current than the seventh and eighth transistors Tr7 and Tr8 coupled in series, the gate area increases if the gate length L is increased. Therefore, the off-leak current of the ninth and tenth transistors Tr9 and Tr10 may decrease and the current consumption of the NOR circuit 30 may be reduced.

The first and second transistors Tr1 and Tr2 included in the inverter circuit 10 may be substantially equal in gate area. For example, in a 65-nm process, when the gate area of the MOS transistor varies 11%, the inversion time of the MOS transistor may vary 1%. In order to optimally perform the static timing analysis, adjustment may be made so that the variation in inversion time is 1% or less. Accordingly, adjustment is made so that the variation in gate area of the MOS transistors included in the inverter circuit 10 is 1% or less.

In the NAND circuit 20, the third to sixth transistors Tr3 to Tr6 may be substantially equal in characteristic variation σn. In the NOR circuit 30, the seventh to tenth transistors Tr7 to Tr10 may be substantially equal in characteristic variation σn. For example, in order to optimally perform the static timing analysis, adjustment is made so that the variation in inversion time is 1% or less. Thus the variation in characteristic variation σn of the MOS transistors included in the NAND circuit 20 and the NOR circuit 30 is 1% or less.

In the above described embodiment, an inverter circuit, NAND circuit or NOR circuit is used. However, another cell may be used.

Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both 4 and B. In addition, the articles "a" and "an" as used in this application and the appended claims should generally be construed to mean "one or more" unless specified otherwise or clear from the context to be directed to a singular form.

The invention claimed is:

1. A semiconductor device comprising:
    a first circuit provided between a power source voltage line and a ground line, the first circuit including at least two first MOS transistors coupled in parallel; and
    a second circuit provided between the power source voltage line and the ground line, the second circuit including at least two second MOS transistors coupled in series, and
    wherein a gate area of at least one of the at least two first MOS transistors is larger than each of the gate areas of the at least two second MOS transistors such that a first characteristic variation of the at least one of the at least two first MOS transistors is substantially equal to a second characteristic variation of the at least two second MOS transistors.

2. The semiconductor device according to claim 1, wherein a first inversion time, which is the time it takes an output signal of the semiconductor device to change from a first level to a second level, is substantially equal to a second inversion time, which is the time it takes the output signal to change from the second level to the first level.

3. The semiconductor device according to claim 1, wherein the first circuit includes the first MOS transistor and a first inverter circuit, and
    wherein the second circuit includes the second MOS transistor and a second inverter circuit.

4. The semiconductor device according to claim 3, Wherein a gate length and a gate width of at least one of the at least two first MOS transistors are such that a first inversion time, which is the time it takes for an output signal of the first inverter circuit to change from a first level to a second level, is substantially equal to a second inversion time, which is the time it takes for the output signal to change from the second level to the first level, and
    wherein the gate length and the gate width of the at least one of the at least two first MOS transistors are such that the gate area of the first MOS transistor is substantially equal to the gate area of each of the at least two second MOS transistors.

5. The semiconductor device according to claim 3, wherein a gate length and a gate width of at least one of the at least two first MOS transistors are such that a first inversion time, which is the time it takes for an output signal of the first inverter circuit to change from a first level to a second level, is substantially equal to a second inversion time, which is the time it takes for the output signal to change from the second level to the first level.

6. The semiconductor device according to claim 1, wherein the gate area of the at least one first MOS transistor and the gate area of each of the at least two second MOS transistors are such that a difference between a variation of the first characteristic variation and a variation of the second characteristic variation is 1% or less.

7. A semiconductor device comprising:
a first circuit arranged between a power source voltage line and a ground line, wherein the first circuit includes at least two first MOS transistors coupled in parallel; and
a second circuit arranged between the power source voltage line and the ground line, wherein the second circuit includes at least two second MOS transistors coupled in series,
wherein a gate area of at least one of the at least two the first MOS transistors is larger than each of the gate areas of the at least two second MOS transistors so that a first characteristic variation of the at least one of the at least two first MOS transistors is substantially equal to a second characteristic variation of the at least two second MOS transistors.

8. The semiconductor device according to claim 7, wherein the gate area of the at least one first MOS transistor is determined by a gate length and a gate width of the at least one first MOS transistor.

9. The semiconductor device according to claim 7, wherein a first inversion time, which is the time it takes for an output signal of the semiconductor device to change from a first level to a second level, is substantially equal to a second inversion time, which is the time it takes for the output signal to change from the second level to the first level.

10. A method for laying out a semiconductor device,
providing a first circuit between a power source voltage line and a ground line, the first circuit including at least two first MOS transistors coupled in parallel; and
providing a second circuit between the power source voltage line and the ground line, the second transistor including at least two second MOS transistors coupled in series,
wherein a gate area of at least one of the at least two first MOS transistors is larger than each of the gate areas of the at least two second MOS transistors such that a first characteristic variation of the at least one of the at least two first MOS transistors is substantially equal to a second characteristic variation of the at least two second MOS transistors.

11. The method according to claim 10, wherein a first inversion time, which is the time it takes an output signal of the semiconductor device change from a first level to a second level, is substantially equal to a second inversion time, which is the time it takes the output signal change from the second level to the first level.

12. The method according to claim 10, wherein the first circuit includes the first MOS transistor and a first inverter circuit, and
wherein the second circuit includes the second MOS transistor and a second inverter circuit.

* * * * *